(12) United States Patent
Schneebauer et al.

(10) Patent No.: US 12,090,778 B2
(45) Date of Patent: Sep. 17, 2024

(54) VEHICLE COMPONENT AND METHOD FOR PRODUCING A VEHICLE COMPONENT

(71) Applicant: Bayerische Motoren Werke Aktiengesellschaft, Munich (DE)

(72) Inventors: Martin Schneebauer, Munich (DE); Frauke Thienel, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 490 days.

(21) Appl. No.: 17/293,822

(22) PCT Filed: Oct. 7, 2019

(86) PCT No.: PCT/EP2019/076990
§ 371 (c)(1),
(2) Date: May 13, 2021

(87) PCT Pub. No.: WO2020/108832
PCT Pub. Date: Jun. 4, 2020

(65) Prior Publication Data
US 2022/0009276 A1    Jan. 13, 2022

(30) Foreign Application Priority Data
Nov. 29, 2018    (DE) ............ 10 2018 130 347.5

(51) Int. Cl.
*B44C 5/04*    (2006.01)
*B41J 3/407*    (2006.01)
*B44F 1/04*    (2006.01)
*B60R 13/00*    (2006.01)

(52) U.S. Cl.
CPC .......... *B44C 5/0453* (2013.01); *B41J 3/4073* (2013.01); *B44F 1/045* (2013.01); *B60R 13/00* (2013.01)

(58) Field of Classification Search
CPC ............................. B44C 5/0453; B44F 1/045
See application file for complete search history.

(56) References Cited

U.S. PATENT DOCUMENTS

| | | | |
|---|---|---|---|
| 4,645,970 A * | 2/1987 | Murphy | B32B 17/10192 40/544 |
| 4,772,096 A * | 9/1988 | Kai | G02B 5/00 359/601 |
| 2003/0096073 A1* | 5/2003 | Cser | B44C 1/105 156/289 |

(Continued)

FOREIGN PATENT DOCUMENTS

| | | |
|---|---|---|
| CN | 102282288 A | 12/2011 |
| DE | 10 2014 202 993 A1 | 8/2015 |

(Continued)

OTHER PUBLICATIONS

International Search Report (PCT/ISA/210) issued in PCT Application No. PCT/EP2019/076990 dated Jan. 15, 2020 with English translation (five (5) pages).

(Continued)

*Primary Examiner* — Cachet I Proctor
(74) *Attorney, Agent, or Firm* — Crowell & Moring LLP

(57) ABSTRACT

A vehicle component includes a colored translucent plastic component having a front side and a back side, and a metallic layer arranged on the back side of the plastic component.

3 Claims, 3 Drawing Sheets

(56) References Cited

U.S. PATENT DOCUMENTS

| | | | |
|---|---|---|---|
| 2006/0262003 A1* | 11/2006 | Kamiya | B32B 15/08 342/5 |
| 2008/0044658 A1 | 2/2008 | Ludwig et al. | |
| 2011/0273356 A1* | 11/2011 | Kawaguchi | H01Q 1/44 204/192.27 |
| 2015/0151519 A1 | 6/2015 | Siemsen et al. | |
| 2017/0182932 A1 | 6/2017 | Muenker et al. | |
| 2017/0346172 A1 | 11/2017 | Supik et al. | |
| 2018/0162028 A1* | 6/2018 | Han | B29C 45/0003 |

FOREIGN PATENT DOCUMENTS

| | | |
|---|---|---|
| DE | 20 2015 001 340 U1 | 6/2016 |
| DE | 10 2016 209 414 A1 | 11/2017 |
| EP | 1 892 182 A1 | 2/2008 |
| EP | 1 902 902 A1 | 3/2008 |
| EP | 1 344 688 B1 | 11/2012 |
| EP | 2 885 122 B1 | 6/2018 |
| JP | 60-251268 A | 12/1985 |
| WO | WO 99/19152 A1 | 4/1999 |
| WO | WO 2013/139361 A1 | 9/2013 |
| WO | WO 2015/049242 A1 | 4/2015 |
| WO | WO 2015/150035 A1 | 10/2015 |

OTHER PUBLICATIONS

German-language Written Opinion (PCT/ISA/237) issued in PCT Application No. PCT/EP2019/076990 dated Jan. 15, 2020 (seven (7) pages).

German-language Search Report issued in German Application No. 10 2018 130 347.5 dated Oct. 21, 2019 with partial English translation (12 pages).

Chinese-language Office Action issued in Chinese Application No. 201980066218.8 dated Feb. 7, 2023 with English translation (10 pages).

Chinese-language Office Action issued in Chinese Application No. 201980066218.8 dated Sep. 7, 2022 with English translation (13 pages).

Chinese-language Office Action issued in Chinese Application No. 201980066218.8 dated Oct. 31, 2022 with English translation (11 pages).

* cited by examiner

VEHICLE COMPONENT AND METHOD FOR PRODUCING A VEHICLE COMPONENT

BACKGROUND AND SUMMARY OF THE INVENTION

The present invention relates to a vehicle component and to a method for producing a vehicle component.

Metal coatings which are applied in thin layers by physical vapor deposition (PVD) are suitable for light transmission or radar transmission through them. The customer may therefore be offered functions in the decorative components such as masks or in the external skin components. Because of the target used, however, PVD coatings are very restricted in coloration. When radar transmissivity is added, only very few coatings are suitable and the coloration is therefore even more restricted.

Against this background, the object of the present invention is to provide a way in which the range of colors of light-transmissive and radar-transmissive components can be increased.

The object is achieved by a vehicle component according to the claimed invention.

A vehicle component comprising a colored translucent plastic component having a front side forming the visible side of the vehicle component and a rear side, and a metal layer which is arranged on the rear side of the plastic component, is provided.

A method for producing a vehicle component is furthermore provided. The method is suitable in particular for producing the vehicle component described above, and has the same technical effects and advantages as described with respect thereto. The method comprises:
   producing a colored translucent plastic component having a front side and a rear side, and
   depositing a metal layer on the rear side of the plastic component.

By the layerwise arrangement of a colored translucent body and a metal layer, a colored configuration of the vehicle component is possible in a particularly simple way. In the assembled state, the observer looks at the front side of the plastic component, which forms the visible side of the vehicle component. Light passes through the translucent component and is reflected at the metal layer on the rear side. In combination, the customer sees a metal layer configured in color on the visible side. A mixed color is obtained for the observer, which may be varied versatilely in a simple way by the selection of the metal layer and by the color and transmission of the plastic component.

The metal layer is preferably formed to be thick enough that light in the visible range is reflected by the metal layer, and thin enough that radio waves and radar radiation can still pass through the metal layer. The layer thickness of the metal layer may preferably be in the range from 30 to 50 nm. The layer is particularly preferably formed by PVD. By using PVD, it is possible to achieve layer thicknesses so thin that radar transmissivity is obtained. Preferably, silicon or indium is used for the metal layer. These metals form aggregations in the form of islands when they are applied onto a substrate by PVD, so that the radar transmissivity is further increased. For a uniform appearance of the component, it is preferable for the metal layer to fully cover the rear side of the plastic component.

In order to achieve a color effect in which the metallic aspect still exerts an effect sufficiently, it has been found to be particularly advantageous for the transmission of the plastic component to be in a range from 10% to 70%. Here, a transmission is intended to mean the transmissivity of the plastic component for light in the visible range, i.e. a component having a transmission of 10% transmits 10% of the incident visible light.

In principle, all transparent and translucent plastic materials may be envisioned as a material for the plastic body. The plastic body is particularly preferably formed from a transparent plastic material, for example from polycarbonate or from PMMA. Corresponding color pigments may additionally be added to the plastic material for coloration.

In one configuration which is particularly simple to produce, the plastic component consists of a colored translucent plastic body, i.e. the plastic component does not comprise any further layers. In this case, the plastic body comprises coloring pigments and preferably has a corresponding aforementioned transmission.

In alternative configurations, the plastic component comprises a multilayered structure. For example, the color effect is produced by the plastic component, in one configuration, comprising a transparent plastic body and at least one coloring layer, preferably arranged on the rear side of the plastic body. In this embodiment, a homogeneous color effect may be achieved in a way which is particularly simple and reliable in terms of processing. The color effect is achieved merely by the coloring layer, different wall thicknesses in the plastic body having no significant effect on the color effect of the overall component.

In a further configuration, the plastic component comprises a colored translucent plastic body and at least one coloring layer arranged on the rear side of the plastic body. By the superposition of a coloring layer on the colored plastic body, the range of achievable colors may be increased in a simple way. Deliberate color effects may also be produced by different wall thicknesses in the plastic body.

The coloring layer is likewise a translucent layer. The coloring layer is preferably formed as an uninterrupted layer and formed on the entire rear side of the plastic body. The layer thickness of the coloring layer may preferably be in a range from 5 to 40 μm.

The coloring layer may, for example, be printed on. In one preferred configuration, the color layer is formed by an inkjet method. In the inkjet method, ink in the form of individual drops is applied in a controlled manner onto the substrate to be printed. By using inkjet methods, the required small layer thicknesses can be reproduced very exactly. In addition, layers produced by the inkjet method are distinguished by a good visual appearance. Furthermore, the printing method allows great configurational latitude, for example in respect of multicolored patterns.

The production of the plastic component may correspondingly comprise the steps according to which the transparent or colored translucent plastic body is initially produced in an injection molding process or injection-compression molding process, and at least one coloring layer is subsequently printed on the rear side of the plastic body by the inkjet method.

In addition to the configurations described, it is possible for the plastic component furthermore to comprise a translucent colored cover layer, which is arranged on the front side of the plastic body. This cover layer is preferably formed as a plastic layer.

The colored cover layer may, for example, be a colorated polyurethane or polycarbonate layer. The use of further plastics that can be translucently colorated is likewise conceivable. If, in one configuration, the colored cover layer is a polyurethane-based layer, protection of the component against mechanical damage may additionally be achieved by this layer.

The cover layer may, for example, be molded onto the plastic body. The production of the plastic component may thus comprise:

producing the plastic body in an injection molding process or an injection-compression molding process, and
molding a translucent colored cover layer on the front side of the plastic body.

This may, for example, be done in an injection molding process or RIM (reaction injection molding) process. For example, the cover layer may be produced in a subsequent process on the same machine as the one in which the plastic body was produced, for example by the multicomponent method by using a rotary or sliding table, by using the insert technique, or in the turning method by using an index plate. The colored cover layer may also be molded on in a subsequent process in another machine (insert molding). In one preferred variant of the method, a combination of an injection molding machine and a polyurethane device having additional color modules is used, in which the plastic body (for example polycarbonate) is produced by using a thermoplastic injection molding method and the colored cover layer is applied as polyurethane by applying reaction injection molding (RIM) directly onto the previously molded plastic body.

When using the colored cover layer, it is also conceivable for the coloring layer to be omitted in order to simplify production. In one configuration, for example, the plastic component may consist of a transparent plastic body and a translucent colored cover layer, which is arranged on the front side of the plastic body. The color effect achievable in the vehicle component by the colored cover layer on the front side of the plastic body and the metal layer on its rear side is similar to that when using a coloring layer between a plastic body and a metal layer.

With the vehicle components described, versatile light and color effects can be produced in a simple way. Such vehicle components may, for example, be used as masks in the interior area. It is, however, particularly preferred for the vehicle component to be an external skin component, for example a spoiler. It is also possible to configure the described vehicle component to be radar-transmissive by the selection of suitable plastics, for example PC, and a correspondingly thin metal layer, so that it may preferably be a radar covering with which a radar device, for example a distance warning device, is externally clad. In this case, the rear side of the vehicle component faces toward the radar device in the assembled state.

Further advantages, features and details of the invention may be found from the following description, in which exemplary embodiments of the invention are described in detail with reference to the drawings. In this case, the features mentioned in the claims and in the description may respectively be essential to the invention individually per se or in any desired combination. When the term "can" is used in this application, this includes both the technical possibility and the actual technical implementation.

Exemplary embodiments will be described below with the aid of the appended drawings.

DETAILED DESCRIPTION OF THE DRAWINGS

FIGS. 1 to 5 show various configurations of exemplary vehicle components. Features which are the same are provided with the same references and are not explained again for each figure in order to avoid repetition.

Figure 1:
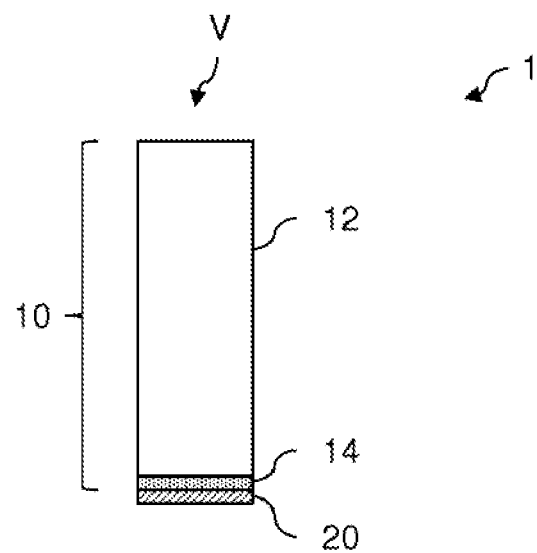
FIGS. 1 to 5 show schematic sectional views of possible layer structures of exemplary vehicle components.

FIG. 1 shows a sectional view of a first configuration of a vehicle component. The vehicle component 1 comprises a colored translucent plastic component 10, on the rear side of which a metal layer 20 deposited by PVD is arranged. The plastic component 10 comprises a transparent plastic body 12, for example made of PMMA or PC, as well as a translucent coloring layer 14, which is formed on the rear side of the plastic body 12 and is consequently arranged between the plastic body 12 and the metal layer 20. The coloring layer 14 is preferably printed onto the plastic body 12 by an inkjet method.

Figure 2:
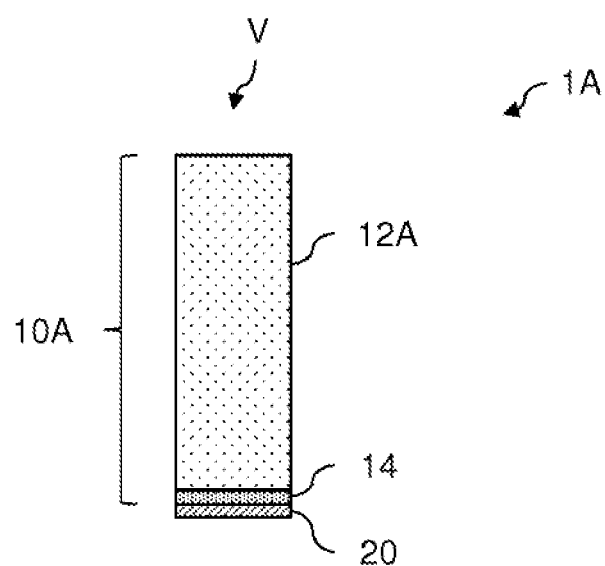

FIG. 2 shows an alternative configuration of a vehicle component 1A, which differs from the configuration in FIG. 1 in that the plastic body is configured to be not transparent but likewise colored. The plastic component 10A consequently comprises a translucent colored plastic body 12A and the translucent coloring layer 14 arranged on the rear side thereof.

Figure 3:
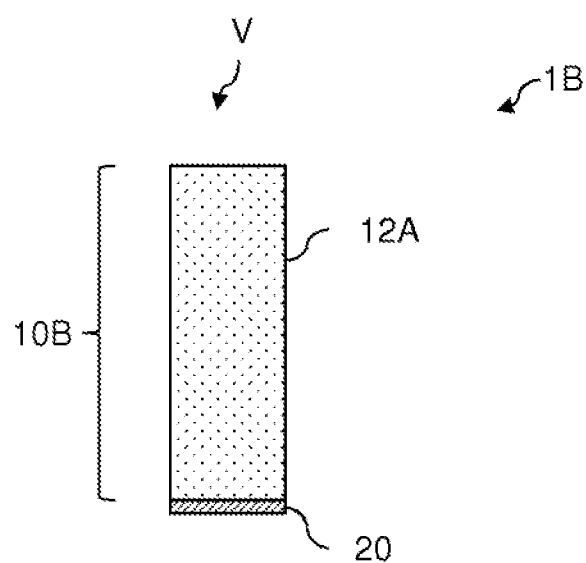

If the plastic body 12A is colorated, it is also possible to omit the coloring layer 14. A corresponding configuration is represented in FIG. 3. In this configuration, the plastic component 10B of the vehicle component 1B consists only of the colorated translucent plastic body 12A.

Figure 4:
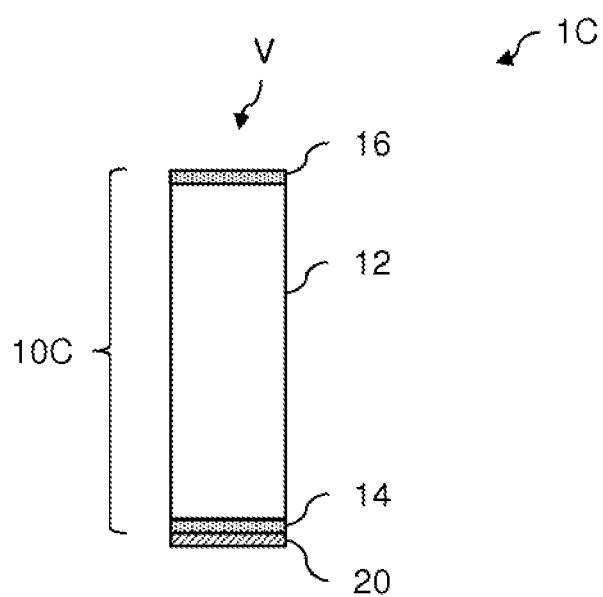

FIG. 4 shows a vehicle component 1c in which a translucent colored cover layer 16 furthermore being arranged on the front side of the plastic body 12 of the vehicle component 1A shows in FIG. 1. The colored cover layer 16 is preferably a polyurethane layer, protection of the vehicle component 1C against mechanical wear simultaneously being achieved. The plastic component 10C in this configuration consequently contains the coloring layer 14, the transparent plastic body 12 and the cover layer 16. As in the exemplary embodiment of FIG. 3, with this configuration a greater range in the color configuration may also be achieved by the use of two colored layers.

Figure 5:
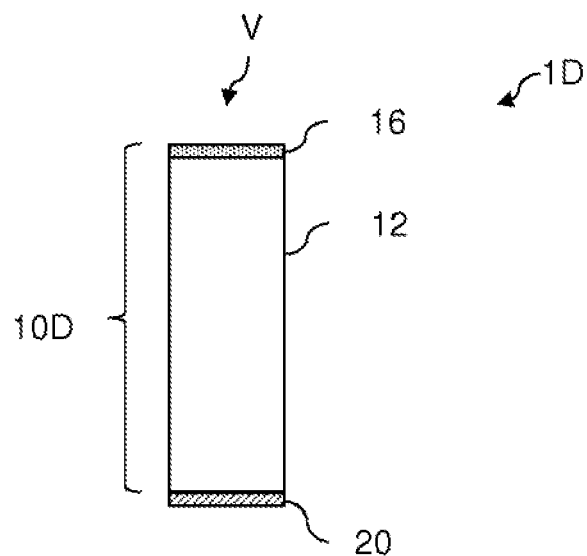

The vehicle component 10 shown in FIG. 5 differs from the configuration according to FIG. 4 in that the coloring layer 14 has been omitted, i.e. the metal layer 20 is deposited on the plastic body 12. If the plastic body 12 is configured as a transparent body, the color effect is produced merely by the colored layer 16 and the metal layer 20. As an alternative (not represented), it is conceivable to configure the plastic body 12 in FIG. 5 as a colored body, and for example to replace it with the plastic body 12A.

The overall transmission of the plastic components 10, 10A, 10B, 10C and 10D, i.e. the transmission through all layers of the plastic component, is preferably in a range from 10% to 70%, a metallic colored overall impression, which is given by the superposition of the metal layer 20 and the colored layers 14 and/or 16, and optionally the colorated plastic body 12A, being obtained when looking at the front side V of the vehicle component 1, 1A, 1B, 1C, 1D.

Figure 6:
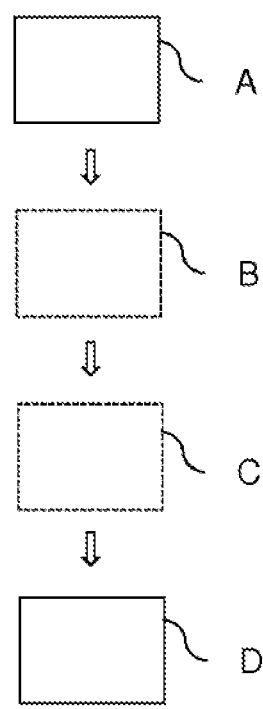
FIG. 6 shows a schematic method sequence.

The method for producing the vehicle component is shown in a schematic view in FIG. 6. Initially, in step A, the plastic body is produced in an injection molding process or injection-compression molding process. If a colored cover layer is intended to be formed on the plastic body, the optional step B is carried out. In step B, the colored cover layer is molded onto the plastic body. This may be done in the same process as the production of the plastic body or in a separate process, for example RIM. If a coloring layer is intended to be formed on the plastic body, this is printed in the optional step C onto the rear side of the plastic body, preferably by inkjet printing. In step D, the metal layer is deposited on the plastic body, or on the previously printed coloring layer.

LIST OF REFERENCES

1, 1A, 1B, 1C, 1D vehicle component
10, 10A, 10B, 10C, 10D plastic component
12, 12A plastic body
14 coloring layer
16 colored cover layer
20 metal layer
A, B, C, D method steps
V front side

What is claimed is:

1. A method for producing a vehicle component, the method comprising:
   producing a colored translucent plastic component having a front side and a rear side; and
   depositing a metal layer on the rear side of the plastic component,
   wherein producing the plastic component comprises:
      producing a plastic body by an injection molding process or an injection-compression molding process; and
      molding a colored cover layer on a front side of the plastic body.

2. The method according to claim 1,
   wherein the plastic component is produced to have a transmission between 10% and 70% in a visible range of light.

3. The method according to claim 1, wherein producing the plastic component further comprises:
   printing at least one translucent coloring layer on a rear side of the plastic body by an inkjet printing method.

* * * * *